United States Patent [19]

Mori et al.

[11] Patent Number: 4,806,769
[45] Date of Patent: Feb. 21, 1989

[54] DISK EXCHANGEABLE TARGET MECHANISM WITH EFFECTIVE COOLING MEANS, FOR ION IMPLANTATION SYSTEM

[75] Inventors: Haruhisa Mori; Motoo Nakano, both of Yokohama, Japan

[73] Assignee: Fujitsu Limited, Kawasaki, Japan

[21] Appl. No.: 51,397

[22] Filed: May 19, 1987

[30] Foreign Application Priority Data

May 20, 1986 [JP] Japan ................. 61-113616

[51] Int. Cl.$^4$ .............................................. G21K 5/08
[52] U.S. Cl. ............................ 250/443.1; 250/441.1; 250/442.1; 250/492.2; 313/35
[58] Field of Search ............. 250/440.1, 441.1, 442.1, 250/443.1, 492.1, 492.2, 492.3, 398, 400; 315/111.81; 313/35

[56] References Cited

U.S. PATENT DOCUMENTS 4,453,080  6/1984  Berkowitz ................. 250/443.1
4,599,516  7/1986  Taya et al. ................. 250/443.1

FOREIGN PATENT DOCUMENTS 0178803  4/1986  European Pat. Off. ......... 250/443.1

OTHER PUBLICATIONS

G. Ryding et al, "A High-Throughput Mechanically Scanned Target Chamber", 1981, Nuclear Instruments and Method, No. 189, p. 324, North Holland Publishing Company.

Primary Examiner—David K. Moore
Assistant Examiner—Mark R. Powell
Attorney, Agent, or Firm—Staas & Halsey

[57] ABSTRACT

An improved disk exchangeable target mechanism for an ion implantation system includes an effective cooling means for preventing thermal damage to a resist and for improving an implantation quality of semiconductor wafers. The target mechanism includes a metal disk on which a semiconductor wafer(s) to be ion-implanted are mounted on a first face thereof, a support including a metal base having the target disk mounted thereon, and a shaft incorporated with the base, and a medium, provided between a second face of the target disk opposite to the first face and the base, for thermally contact therebetween. Preferably, the base of the support is provided with a cavity and the shaft is provided with holes communicating with the cavity, whereby a cooling medium is inserted into the cavity through one hole and is drained from the cavity through another hole. Furthermore, preferably, the target disk is provided with a thermal transportation unit, such as heat pipes, for transporting thermal energy from a portion(s) at which a high temperature is caused by ion implantation energy, to another portion(s) at which the temperature is low.

20 Claims, 3 Drawing Sheets

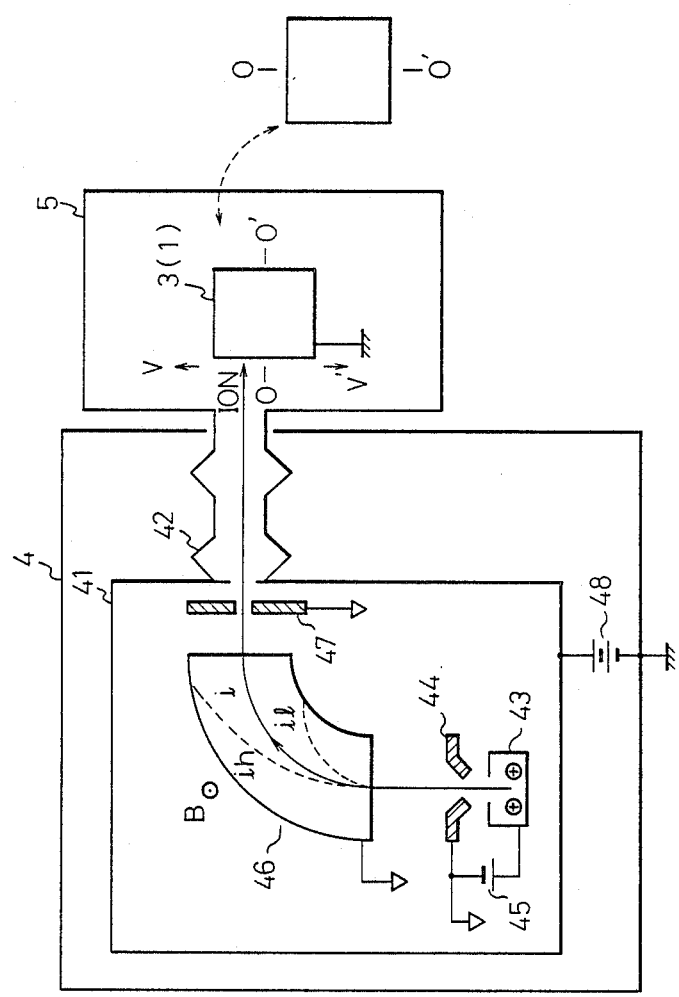
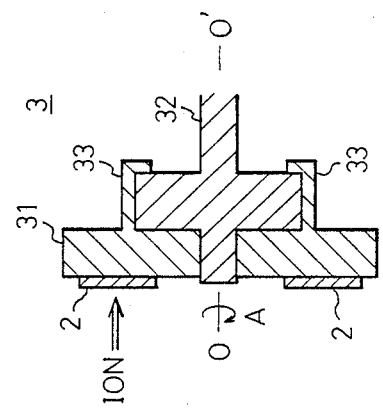
Fig. 1
Fig. 2 PRIOR ART

DISK EXCHANGEABLE TARGET MECHANISM WITH EFFECTIVE COOLING MEANS, FOR ION IMPLANTATION SYSTEM

BACKGROUND OF THE INVENTION

1. Field of the Invention

The present invention relates to an ion implantation system used for manufacturing semiconductor devices. More particularly, it relates to a cooling of an ion target mechanism in the ion implantation system using a high ion dosage.

2. Description of the Related Art

There is an urgent need for a high-speed throughput in an ion implantation (injection) process. The throughput speed is generally defined by the following times: an ion implantation time $T_I$, a handling time $T_H$ for exchanging a target disk having semiconductor wafers thereon and mounted on a mechanism, and a time $T_P$ for pumping a vacuum chamber. An improvement of the throughput speed can be achieved by shortening these times.

The ion implantation time $T_I$ can be reduced by increasing an ion beam current from approximately 10 mA to 30 mA, which will provide a high ion dosage, approximately $10^{15}$ cm$^{-2}$ to $10^{16}$ cm$^{-2}$. On the other hand, the reduction of the handling time $T_H$ and the pumping time $T_P$ can be realized by applying a method in which dual end stations are used; a method in which a system has two end stations and the wafer handling and the vacuum pumping for one end station are carried out during the ion implantation of the other end station. Another method for reducing the pumping time $T_P$ is a direct-exchange of the semiconductor wafers.

The dual end station method, however, requires the use of a bulky facility, and the direct wafer exchange method in the vacuum chamber involves a difficult operation, and the quality of a semiconductor wafer may be reduced because dust may be generated from movable portion of the target disk in the vacuum chamber. Therefore, a target disk exchange method has been proposed ("A high-throughput mechanically scanned target chamber", G. Ryding and A. Armstrong, on pp. 319 to 325, "Nuclear Instruments and Methods", No. 189, by North Holland Publishing Company, 1981).

The prior art ion implantation system using the disk exchangeable target mechanism has a low implantation reliability due to heat generated during subjecting the semiconductor wafers on the disk to high ion dosages. This will be described in more detail with reference to a specific example.

SUMMARY OF THE INVENTION

An object of the present invention is to provide an ion implantation system using a disk exchangeable target mechanism which can be effectively cooled even when semiconductor wafers on the disk are being subjected to a high ion dosage.

Another object of the present invention is to improve the throughput speed of ion implantation by using the above ion implantation system.

Still another object of the present invention is to improve the reliability of ion implantation when using a high ion dosage.

According to the present invention, there is provided a disk exchangeable target mechanism of an ion implantation system including an exposure chamber for inserting the disk exchangeable target mechanism and introducing accelerated ion beams directed to a semiconductor wafer on the disk exchangeable target mechanism, having: a metal target disk on which a semiconductor wafer(s) to be ion-implanted can be mounted on a first face thereof, a support including a metal base having the target disk mounted thereon, and a shaft incorporated with the base. The support is rotatable in the exposure chamber by a force applied to the shaft during a ion-implantation process, and the target disk is detachable from the support when to be taken out of the exposure chamber. The target mechanism further includes a medium, provided between a second face of the target disk opposing the first face and the base, for providing a thermal contact therebetween.

The thermal contact medium may have a high contactability with metal, and the thermal contact medium may also have a high thermal conductivity. The thermal contact medium further may be stable in a vacuum.

The base of the support may be provided with a cavity, and the shaft may be provided with holes communicated with the cavity. A cooling medium is inserted into the cavity through a hole and the inserted cooling medium is drained from the cavity through another hole.

The target disk may be provided with a thermal transportation unit transporting thermal energy at a portion(s) where the temperature is high by applying ion implantation energy to another portion(s) where the temperature is low.

The thermal transportation unit may include a heat pipe(s), and the heat pipe(s) may include a cooling medium having a low boiling temperature.

The heat pipes may be radially provided with respect to a rotation center of the target disk.

Note, any combinations of the above may be used.

BRIEF DESCRIPTION OF THE DRAWINGS

Other object and features of the present invention will be described below in detail with reference to the accompanying drawings, in which:

FIG. 1 is a block diagram of an ion implantation system to which the present invention is applied;

FIG. 2 is a sectional view of a prior target mechanism used in the ion implantation system shown in FIG. 1;

FIG. 3b is a plan view of a rubber sheet in FIG. 3a;

FIG. 3c is a plan view of a target disk in FIG. 3a;

FIG. 3d is a sectional view of the target disk provided with heat pipes, taken along the line $H_2$—$H_2'$ in FIG. 3a;

DESCRIPTION OF THE PREFERRED EMBODIMENTS

Figure 3A:
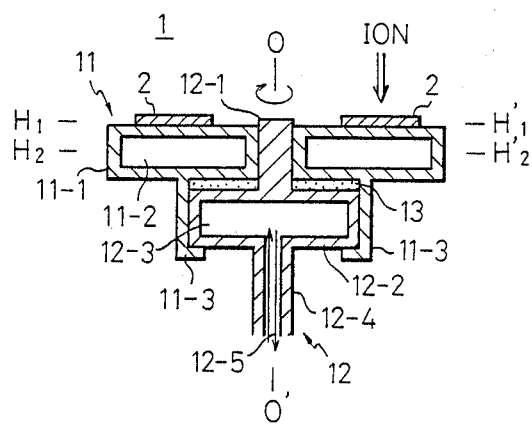
FIG. 3a is a sectional view of an embodiment of a target mechanism in accordance with the present invention which is used in the ion implantation system in FIG. 1.

Before describing the preferred embodiments of the present invention, an example of a prior art system is described with reference to the drawings, for comparison.

FIG. 1 is a block diagram of an ion implantation system to which the present invention can be applied.

In FIG. 1, the ion implantation system includes an outer cabinet 4, an inner cabinet 41, and a first power supply 48 connected between the outer cabinet 4 and the inner cabinet 41. The first power supply 48 provides typically a maximum voltage of 160 KV to 175 KV. In the inner cabinet 41 are provided an ion source 43, and an ion extraction electrode 44. A second power supply 45 is provided between the ion source 43 and the ion extraction electrode 44 and provides typically a voltage of approximately 25 KV to 40 KV, to cause the emission of ion beams from the ion source 43. The emitted ion beams are introduced into an analysis magnet tube 46 installed in the inner cabinet 41. When a magnetic flux B is directed thereto as shown in the drawing, light mass ions $i_l$ and heavy mass ions $i_h$, both contained in the ion beams, are impinged on an inner wall of the analysis magnet wall 46, as shown in the drawing, and are absorbed thereat. As a result, ions i having a predetermined mass are emitted from the analysis magnet tube 46, and a speed thereof is accelerated at an accelerator 42. A low potential side of the power supply 45, the analysis magnet tube 46, and an entrance side of the accelerator 42 are commonly connected to the inner cabinet 41. The voltage of the accelerator 42 is provided by the voltage of the power supply 48, the accelerator 42 accelerating the input ions i by the electric field provided by the above voltage.

The accelerated ions are introduced into an exposure chamber 5. In the implantation process, atmosphere in an inner space of the exposure chamber 5 is pumped out to produce a vacuum therein. A target mechanism is placed in the inner space prior to this pumping. The operation for ion implantation of semiconductor wafers is described below.

FIG. 2 is a sectional view of the target mechanism 3 of the prior art. The target mechanism 3 includes a support shaft 32 of aluminum (Al) or stainless steel and a target disk 31 of Al mounted thereon. A plurality of semiconductor wafers 2 to be implanted are mounted on a surface of the circumference of the target disk 31. The target mechanism 3 is placed in the exposure chamber 5, which is brought to a vacuum condition, in the direction as shown by the broken line arrow in FIG. 1, and is rotated around a rotation center line O—O'. Ion implantation of the semiconductor wafers 2 mounted on the target disk 31 is achieved sequential exposure to the ion beams ION.

The target mechanism 3 can be moved in a vertical direction V—V' in the exposure chamber 5, ensuring an ion implantation of the whole surface of the semiconductor wafers 2.

After completion of the ion implantation, the target mechanism 3 is extracted from the exposure chamber 5. At this time the target mechanism 3 is rotated by 9020, as shown by a broken line in FIG. 1, to bring the wafer mounting surface of the target disk 31 to the horizontal plane. The target disk 31 is then removed from the support shaft 32 by releasing holding claws 33.

A new target disk 31 on which untreated semiconductor wafers 2 are already mounted is then mounted on the support shaft 32. The target mechanism 3 with the new target disk 31 is inserted into the exposure chamber 5, and the ion implantation is carried out for the untreated semiconductor wafers 2.

The ion implanted semiconductor wafers are detached from the target disk 31 removed from the support shaft 32 outside the exposure chamber 5, and thereafter, untreated semiconductor wafers are mounted on the removed target disk 31.

The above disk exchange operation can be applied in the present invention.

The problems of the prior art are now discussed in detail.

Assuming an implantation energy of 80 KeV and a high ion implantation dosage of approximately $1 \times 10^{16}$ cm$^{-2}$, the beam current should be 10 mA, and the beam power should be 800 W. Also, assuming a permanent implantation as for a theoretical analysis is carried out under the above condition, the temperature of the semiconductor wafer may rise to approximately 180° C., giving a temperature difference of approximately 17° C. between the wafer and the target disk, and a temperature difference of approximately 160° C. between the target disk and the support shaft, etc. The above temperature rise depends on the beam power. In practice, the implantation time is approximately 1 to 30 minutes and given a diameter of the target disk of 70 cm, the actual temperature of the wafer may rise by approximately 120° C. to 130° C. during an usual implantation time.

This temperature rise will damage resists on the semiconductor wafers, because the temperature tolerance of the resists is approximately 100° C. In addition, ion implantation at such high temperatures has an adverse affect on the quality of the wafers, because of the difficulty of lattice recovery of the wafer after implantation.

An embodiment of a target mechanism 1 of the present invention will be described with reference to FIGS. 3a to 3d. The ion implantation system of this embodiment is similar to that in FIG. 1, except for the target mechanism 1.

The target mechanism 1 includes a target disk 11 of Al, a support 12 of Al or stainless steel, and a thermal contact means such as a silicon (Si) rubber sheet 13 inserted between the target disk 11 and the support 12. Semiconductor wafers 2 to be implanted are mounted on a surface of the target disk 11 opposite to the surface of the target disk 11 in contact with the Si rubber sheet 13.

In FIG. 3a, the structure of the support 12 includes a first shaft 12-1, a base 12-2, and a second shaft 12-4. A cavity 12-3 is provided in the base 12-2, and a hole 12-5 communicating with the cavity 12-3 is formed in the second shaft 12-4. The support 12 can be rotated in a direction A with respect to a center axis O—O'.

The structure of the target disk 11 comprises a disk 11-1 having a center hole through which the first shaft 12-1 is fitted, and claws 11-3 detachably holding the target disk 11 to the base 12-2 of the support 12. A thermal transportation means 11-2 is provided in the disk 11-1.

Figure 3B:
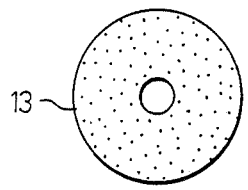

The lower surface of the disk 11-1 and the top surface of the base 12-2 facing the lower surface of the disk 11-1 are precision-machined. However, from a microscopic view point, these surfaces are uneven, and thus, if brought into face-to-face contact, the contact therebetween may be considered to be a point contact. This point contact would limit the thermal transfer from the target disk 11 to the support 12, causing a temperature rise of the target disk 11, and accordingly, a temperature rise of the semiconductor wafers 2 during the ion implantation. The Si rubber sheet 13, as shown in FIG. 3b, is inserted between the lower surface of the disk 11-1 and the top surface of the base 12-2, and functions as a contact means to cause a perfect face-to-face contact between those surfaces. As a result, the above prior art temperature difference between the target disk and the support of a theoretical value of approximately 160° C. can be reduced to a theoretical value of approximately 40° C.

The Si rubber sheet 13 has a thermal transportation coefficient greater than 20 mW/cm$^2$.° C.

Figure 3C:
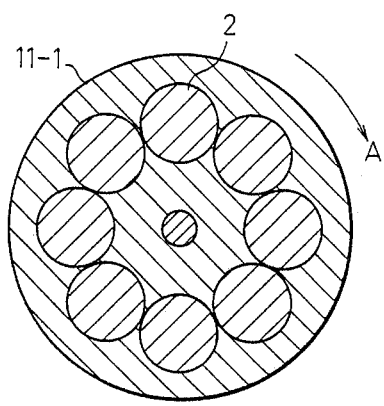

FIG. 3c is a plan view of the disk 11-1 having the wafers 2 mounted thereon, taken along a line H$_1$—H$_1'$ in FIG. 3a. Eight wafers 2 mounted around the circumference of the disk 11-1 are rotated together with the support 12 in the direction A during the implantation.

Figure 3D:
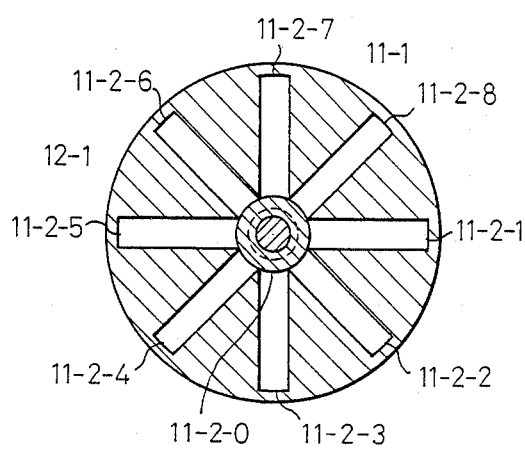

FIG. 3d is a plan view of the disk 11-1 and the thermal transportation means 11-2 provided therein, taken along a line H$_2$—H$_2'$ in FIG. 3a. The thermal transportation means 11-2 includes eight heat pipes 11-2-1 to 11-2-8 provided radially with respect to the rotation center. The heat pipes 11-2-1 to 11-2-8 are installed independently from each other, and each heat pipe is provided with a cavity extending along the longitudinal direction and webs or slots on an inner wall thereof. A cooling medium, such as water, a hydrocarbon fluoride gas e.g., "Freon" (trade name) or ethanol, is inserted in the cavity. The principle of the heat pipe is widely known. When the ion beam exposure causes a rise in the temperature of the wafers 2, the cooling medium at the circumferential edges of the heat pipes beneath the wafers 2 is also heated. Accordingly, a thermal convection is produced between the high temperature portions, i.e., the circumferential edge of the heat pipes, and low temperature portions, i.e., a portion adjacent to the rotation center, resulting in a high speed flow of the cooling medium between the high temperature portions and the low temperature portion through the webs or the slots in accordance with a capillary action, and accordingly, a high speed transporting of thermal energy from the high temperature portions to the low temperature portion.

Thus, the thermal transportation means 11-2 contributes to a lowering of the temperature of the wafers 2.

Further, a cooling medium, for example, water, is circulated through the cavity 12-3 of the base 12-2, which accelerates the cooling of the wafers 2. Namely, the thermal energy at the wafer 2 is distributed by the thermal transportation means 11-2, and the distributed thermal energy is forcibly transferred to the base 12-2 force-cooled from the inner wall of the cavity 12-3 in the base 12-2.

In addition, during the ion implantation, the target disk 11-1 is rotated at a high speed, for example, 1000 rpm, and therefore the cooling medium at the center of the target disk 11-1 is forcibly moved to the circumference thereof, where the temperature is high, accelerating the thermal transportation.

According to the embodiment, the ion implantation process is carried out under the following conditions:
Beam power: 800 W
Implantation time: approximately 15 minutes
Size of Si rubber sheet: 1000 cm$^2$
Cooling medium: Freon gas This results in the temperature at the wafers being approximately 80° C. This temperature satisfies the requirements necessary for the protection of the resist on the wafer and of the wafer quality.

The thermal contact means 13 should have the characteristics of good contactability with metal, high thermal conductivity, and stability in vacuum conditions. Accordingly, the thermal contact means 13 can be a polyfloraethylene film, e.g., "Teflon" (trade name), an RTV (Room Temperature Vulcanization) Si rubber, an Indium (In) film, etc., instead of the Si rubber sheet mentioned above.

Freon gas is vaporized at a temperature higher than approximately 50° C., and this vaporization will accelerate the thermal convection in the heat pipe. Preferably, Freon gas is used as the cooling medium in the heat pipe, rather than water having a boiling point of 100° C.. Ethanol, which vaporizes at approximately 80° C., is also preferable to water as the cooling medium.

As shown by a broken-line circle in FIG. 3d, the heat pipes can be commonly connected at the center portion of the mechanism, where the temperature is low.

After ion implantation, the heated (to approximately 80° C.) target mechanism 1 is taken out of the exposure chamber 5, and the target disk 11 having the ion implanted wafers 2 mounted thereon is removed from the support 12. During the target disk exchange operation, preferably, the target mechanism 1 is forcibly water-cooled while outside exposure chamber 5 by supplying water to the hole 12-5 of the support 12.

Another embodiment of the thermal transportation means will be described with reference to FIG. 4.

Figure 4:
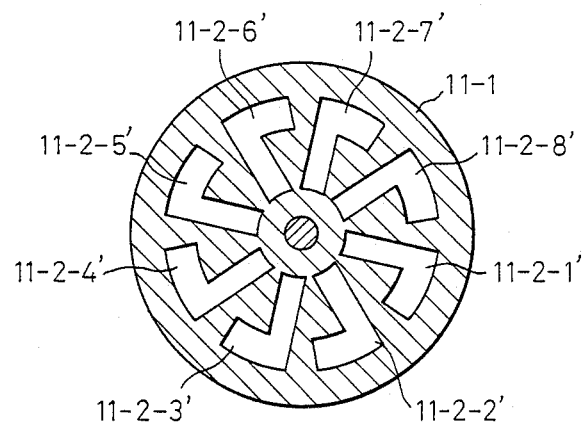
FIG. 4 is a sectional view of the target disk provided with other heat pipes.

FIG. 4 is a plan view of a second variety of heat pipes 11-2-1' to 11-2-8', taken along the line H$_2$-H$_2'$ in FIG. 1 and corresponding to FIG. 3d. In FIG. 4, a circumferential end of each heat pipe, above which the wafer to be ion-implanted is mounted, is bent to form an L-shape, to increase an inner space to which the cooling medium is inserted and from which the heat is removed.

The heat pipes 11-2-1' to 11-2-8' can be replaced by boxes drilled in the mechanism per se.

Still another embodiment of a target mechanism of the present invention will be described with reference to FIG. 5.

Figure 5:
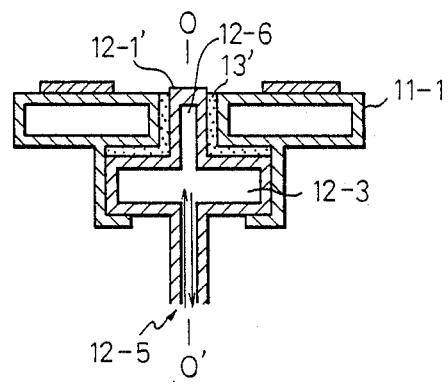
FIG. 5 is a sectional view of another embodiment of a target mechanism in accordance with the present invention.

FIG. 5 is a sectional view of the target mechanism and corresponds to FIG. 3a. In FIG. 5, an Si rubber sheet 13' as the thermal contact means is inserted not only between the lower surface of the target disk 11-1 and the upper surface of the base 12-3 but also between the first shaft 12-1 and an inner wall of the target disk 11-1, thereby increasing the thermal contact area.

Many widely different embodiments of the present invention may be constructed without departing from the spirit and scope of the present invention. It should be understood that the present invention is not limited to the specific embodiments described in this specification, except as defined in the appended claims.

We claim:

1. A disk exchangeable target mechanism of an ion implantation system including an exposure chamber into which the disk exchangeable target mechanism is inserted and in which accelerated ion beams are directed onto semiconductor wafers mounted on the disk exchangeable target mechanism, comprising:
   a metal target disk on which a semiconductor wafer(s) to be ion-implanted is mounted on a first face thereof;
   a support including a metal base upon which said target disk is mounted, and a shaft incorporated with said base, said support being rotatable in said exposure chamber by a force applied to said shaft during an ion-implantation process, said target disk being detachable from said support when taken out of said exposure chamber, and
   said metal base being provided with a cavity through which a coolant is passed; and means, provided between a second face of said target disk opposite to said first face and said base, for providing thermal contact therebetween.

2. A disk exchangeable target mechanism according to claim 1, wherein said thermal contacting means maintains uniform thermal contact with metal.

3. A disk exchangeable target mechanism according to claim 2, wherein said thermal contacting means has a high thermal conductivity.

4. A disk exchangeable target mechanism according to claim 3, wherein said thermal contacting means is stable in a vacuum.

5. A disk exchangeable target mechanism according to claim 4, wherein said thermal contacting means comprises a silicon rubber sheet.

6. A disk exchangeable target mechanism according to claim 4, wherein said thermal contacting means comprises a polyfloraethylene film.

7. A disk exchangeable target mechanism according to claim 1, wherein said shaft is provided with first and second holes communicating with said cavity, and
wherein a cooling medium is inserted into said cavity through the first hole and the inserted cooling medium is drained from said cavity through the second hole.

8. A disk exchangeable target mechanism according to claim 7, wherein said cooling medium in said holes comprises water.

9. A disk exchangeable target mechanism according to claim 1, wherein said target disk is provided with thermal transportation means for transporting thermal energy from a first portion(s) at which a high temperature is caused by ion implantation energy to a second portion(s) at which a temperature is low.

10. A disk exchangeable target mechanism according to claim 9, wherein said thermal transportation means comprises heat pipes.

11. A disk exchangeable target mechanism according to claim 10, wherein said heat pipe contain a cooling medium having a low boiling temperature.

12. A disk exchangeable target mechanism according to claim 11, wherein said heat pipes are provided radially with respect to a rotation center of said target disk.

13. A disk exchangeable target mechanism according to claim 12, wherein said cooling medium is a hydrocarbon fluoride.

14. A disk exchangeable target mechanism according to claim 12, wherein said cooling medium is ethanol.

15. A disk exchangeable target mechanism according to claim 7, wherein said target disk is provided with thermal transportation means for transporting thermal energy at a first portion(s) at which a high temperature is caused by ion implantation energy to a second portion(s) at which the temperature is low.

16. A disk exchangeable target mechanism according to claim 15, wherein said thermal transportation means comprises a heat pipe(s).

17. A disk exchangeable target mechanism for an ion implantation system, the ion implantation system including an exposure chamber into which the disk exchangeable target mechanism is inserted and in which accelerated ion beams are directed onto semiconductor wafers mounted on the disk exchangeable target mechanism, said disk exchangeable target mechanism comprising:
a rotatable support including a disk-shaped metal base having a coolant fluid cavity therein, and a shaft extending axially through the center of the base;
a metal target disk, on which semiconductor wafers to be ion implanted are mounted on a first face thereof, including a central opening and quick release mounting means, said target disk being detachably mounted with said quick release mounting means on said support, the central opening cooperating with the shaft of said support and a first face of said support adjoining a second face of said metal target disk; and
thermal contact means, provided between the second face of said metal target disk and the first face of said support, for providing good thermal conductivity between said metal target disk and said support.

18. A disk exchangeable target mechanism according to claim 17, wherein said metal target disk further includes fluid filled heat pipes formed therein, said heat pipes being sealed and independent of each other, said heat pipes transferring thermal energy from high temperature portions of said metal target disk to low temperature portions thereof.

19. A disk exchangeable target mechanism according to claim 18, wherein said heat pipes are arranged radially with respect a rotational center of said target disk and contain a cooling medium having a low boiling temperature.

20. A disk exchangeable target mechanism according to claim 17, wherein said shaft is provided with central openings which communicate with the cooling fluid cavity in said base and supply and drain a cooling medium to and from the cavity

* * * * *

UNITED STATES PATENT AND TRADEMARK OFFICE
CERTIFICATE OF CORRECTION

PATENT NO. : 4,806,769

DATED : February 21, 1989

INVENTOR(S) : Haruhisa Mori, Motto Nakano

It is certified that error appears in the above-identified patent and that said Letters Patent is hereby corrected as shown below:

Col. 3, line 55, "9020," should be --90°,--.

Col. 5, line 7, "mW/cm$^2$.° C" should be --mW/cm$^2$·°C--.

Col. 6, line 26, "11-2-1' to" should be --11-2-1' to--.

Signed and Sealed this

Tenth Day of October, 1989

Attest:

DONALD J. QUIGG

*Attesting Officer*    Commissioner of Patents and Trademarks